US011695349B2

(12) United States Patent
Hein et al.

(10) Patent No.: US 11,695,349 B2
(45) Date of Patent: Jul. 4, 2023

(54) METHOD FOR CONTROLLING A POWER CONVERTER

(71) Applicant: Wobben Properties GmbH, Aurich (DE)

(72) Inventors: Yves Hein, Rostock (DE); Hans-Günter Eckel, Rostock (DE)

(73) Assignee: Wobben Properties GmbH, Aurich (DE)

(*) Notice: Subject to any disclaimer, the term of this patent is extended or adjusted under 35 U.S.C. 154(b) by 53 days.

(21) Appl. No.: 17/521,134

(22) Filed: Nov. 8, 2021

(65) Prior Publication Data

US 2022/0149749 A1 May 12, 2022

(30) Foreign Application Priority Data

Nov. 10, 2020 (EP) .................................... 20206736

(51) Int. Cl.
*H02M 7/49* (2007.01)
*H02M 7/493* (2007.01)
(Continued)

(52) U.S. Cl.
CPC ...... *H02M 7/493* (2013.01); *G01R 19/16538* (2013.01); *H02J 3/381* (2013.01);
(Continued)

(58) Field of Classification Search
CPC ............. H02M 1/0003; H02M 1/0009; H02M 1/0012; H02M 1/0025; H02M 1/084;
(Continued)

(56) References Cited

U.S. PATENT DOCUMENTS

2007/0121354 A1* 5/2007 Jones ...................... H02J 3/381
363/67
2009/0284233 A1* 11/2009 Murdock .................. G05F 1/70
323/205
(Continued)

FOREIGN PATENT DOCUMENTS

EP        3 297 150 A1    3/2018
WO    WO-2018138184 A1 *  8/2018  ............... F03D 7/00

*Primary Examiner* — Thienvu V Tran
*Assistant Examiner* — Shahzeb K Ahmad
(74) *Attorney, Agent, or Firm* — Seed IP Law Group LLP

(57) ABSTRACT

A method for controlling a power converter, which in particular has partial power converters connected in parallel, is provided. The method includes determining a nominal voltage for the power converter; and dividing an output voltage for the power converter into a number of, in particular equal, voltage ranges. The voltage ranges are limited by a discrete upper voltage limit and a discrete lower voltage limit and the voltage ranges can be adjusted by switching the power converter, in particular the partial power converters. The method includes allocating the nominal voltage a voltage range with a discrete upper and lower voltage limits; allocating a first switch setting to the lower voltage limit; allocating a second switch setting to the upper voltage limit; and switching between the first switch setting and the second switch setting so that the power converter generates an actual voltage corresponding to the nominal voltage.

21 Claims, 8 Drawing Sheets

(51) Int. Cl.
  *H02M 1/00*    (2006.01)
  *G01R 19/165*  (2006.01)
  *H02J 3/38*    (2006.01)
  *H02M 1/084*   (2006.01)
  *H02M 1/12*    (2006.01)
  *H02M 3/158*   (2006.01)

(52) U.S. Cl.
  CPC ......... *H02M 1/0025* (2021.05); *H02M 1/084* (2013.01); *H02M 1/126* (2013.01); *H02J 2300/28* (2020.01); *H02M 1/0003* (2021.05); *H02M 3/1584* (2013.01)

(58) Field of Classification Search
  CPC ...... H02M 1/12; H02M 3/157; H02M 3/1584; H02M 5/40; H02M 5/44; H02M 5/45; H02M 5/458; H02M 7/42; H02M 7/483; H02M 7/487; H02M 7/493; G01R 19/16538; H02J 3/382; H02J 2300/28
  See application file for complete search history.

(56) References Cited

U.S. PATENT DOCUMENTS

2014/0320184 A1\* 10/2014 Chen ..................... H03L 7/0891
                                                   327/156
2017/0284370 A1\* 10/2017 Gensior ................ H02P 9/107
2019/0260309 A1   8/2019 Weissmann et al.
2022/0069703 A1\*  3/2022 Krishnamurthy ... H02M 3/1584

\* cited by examiner

METHOD FOR CONTROLLING A POWER CONVERTER

BACKGROUND

Technical Field

The present invention relates to a method for controlling a power converter as well as to a power converter of this type.

Description of the Related Art

Power converters are dormant electrical devices or installations for converting an electrical type of current (direct current, alternating current) into the respective other type, or for changing characteristic parameters, such as voltage and/or frequency, for example.

Power converters for converting alternating current into direct current are referred to as rectifiers.

Power converters for converting direct current into alternating current are referred to as inverters.

Power converters for converting a first alternating current into a second alternating current are referred to as converters.

Power converters for converting a first direct voltage into a second direct voltage are referred to as rectifiers.

In the field of producers of electrical energy, in particular in the case of wind power installations or photovoltaic installations, it is common to connect a plurality of power converters or power converter modules or partial power converters in parallel to form a power converter system, in particular in order to increase the total power.

In order to prevent circulating currents within this power converter system, for example, measures must be taken which at the same time do not qualitatively or quantitatively reduce the power output of the power converter system.

When controlling these power converter systems, a plurality of further criteria are additionally to be taken into account, such as the compliance with limit values for the intermediate circuit voltage, potential ring currents or network requirements, for example.

One disadvantage with previously known methods is that there is no coordination of the switching operations beyond the limit of the power converter modules.

BRIEF SUMMARY

One or more embodiments provide a method for controlling power converter systems which have a plurality of partial power converters connected in parallel.

A method for controlling a power converter, which in particular has a plurality of partial power converters connected in parallel, is thus proposed.

In this case, the power converter is preferably designed as an inverter or converter system and comprises a plurality of partial inverters or partial inverter modules or partial converters or partial converter modules which are connected in parallel to one another, in particular in order to add up the power output of the individual parts or modules in such a way that the total power of the power converter, i.e., the inverter or the converter, is increased.

The power converter additionally has a control unit which comprises a control system which is superordinate to the control devices of the individual partial power converters. The power converter therefore has a hierarchical control structure. In addition, the individual partial power converters are preferably coupled on the DC side and decoupled on the AC side. The power converter therefore preferably only has parasitic inductances on the AC side. The decoupling on the AC side is therefore greater than the decoupling on the DC side at least by a factor of 10, for example.

The power converter is additionally connected at least to one producer of electrical energy on the input side, for example to a wind power installation generator indirectly via a direct voltage intermediate circuit and a rectifier or to a photovoltaic installation via a direct voltage intermediate circuit.

The control unit is preferably designed as described hereinafter.

For controlling a power converter of this type, which has a plurality of partial power converters connected in parallel, a method is proposed, comprising the steps: determining a nominal voltage for the power converter; dividing an output voltage for the power converter into a number of, in particular equal, voltage ranges, wherein the voltage ranges are limited by a discrete upper voltage limit and a discrete lower voltage limit and the voltage ranges can be adjusted by switching the power converter, in particular the partial power converters; allocating the nominal voltage to one of these voltage ranges with a discrete upper voltage limit and a discrete lower voltage limit; allocating a first switch setting to the lower voltage limit; allocating a second switch setting to the upper voltage limit; switching between the first switch setting and the second switch setting, so that the power converter generates an actual voltage which essentially corresponds to the nominal voltage.

In a first step, a nominal voltage is therefore firstly determined for the power converter. This can take place by way of a wind power installation control system which is superordinate to the control unit of the power converter, for example.

In addition, an output voltage which is available to the power converter is determined. This takes place by measuring the intermediate circuit voltage or by way of a further signal or is stored in the control unit of the power converter as a fixed value, for example. In this case, the output voltage can be used in the form of a set point value and an actual value.

In one further step, this intermediate circuit voltage is divided into a number of equal, in particular equal-sized, voltage ranges, for example into 10 times 100 volts (V).

These voltage ranges are in each case limited by a discrete upper voltage limit and a discrete lower voltage limit, for example 300 volts as a lower voltage limit and 400 volts as an upper voltage limit. In addition, the lower voltage limit preferably forms the upper voltage limit of a further voltage range which is below this voltage range. In addition, the upper voltage limit preferably forms the lower voltage limit of a further voltage range which is above this voltage range. The upper and lower voltage limits which are allocated to a voltage range are also referred to as adjacent voltage limits.

In one further step, the nominal voltage is allocated to a voltage range. For example, the nominal voltage is 350 volts and is thus allocated to the voltage range of 300/400 volts.

In one further step, a switch setting, in particular of a switch of a power converter or a partial power converter, is in each case then allocated to the lower and the upper voltage limit, i.e., 300 volts and 400 volts, for example, of this voltage range.

These switch settings are then switched between with a clock frequency in such a way that the power converter generates an actual voltage which essentially corresponds to the nominal voltage of 350 volts, for example.

In one embodiment, switching between the first switch setting and the second switch setting takes place depending on all output currents.

For this purpose, all output currents of all partial power converters are detected and transferred to the control unit, for example.

The method therefore further comprises the step: ascertaining all output currents, in particular of each partial power converter.

From these output currents detected in this way, a difference is subsequently formed which is taken into account when switching.

The method therefore also further comprises the step: determining a difference between a highest output current of a partial power converter and a lowest output current.

In this case, it is in particular proposed to ascertain the difference between a highest output current of a partial converter and the lowest output current of a partial converter, and, depending on this difference, to carry out switching operations, in particular such that the difference becomes smaller, preferably becomes zero. If this difference exceeds a certain threshold, for example, a switch takes place.

The method preferably further comprises the step: specifying a limit value for the difference and performing switching if the limit value is exceeded.

It is therefore in particular proposed to specify a specific limit value for the difference, in particular the difference between a highest output current of a partial converter and the lowest output current of a partial converter and to switch if this limit value is exceeded.

In this case, switching takes place in particular such that the difference becomes smaller, in particular becomes zero.

In one further embodiment, switching between the first switch setting and the second switch setting takes place depending on a voltage.

It is therefore also proposed to additionally or alternatively take into account the output voltage.

The method therefore preferably further comprises the step: determining a voltage from the first switch setting and/or the second switch setting.

A voltage error is preferably determined by comparing the actual voltage with the nominal voltage.

It is therefore in particular also proposed to detect the actual voltage of the power converter and to compare it with the nominal voltage of the power converter and to take into account the resulting voltage error when switching.

The voltage error is preferably integrated to form a virtual flow error.

By using the virtual flow as a variable, the problem can in particular be addressed in which the power converter or a partial power converter or a switch of those (partial) power converters is between two switching states. The virtual flow enables an implementation in the form of an I-controller, which makes the control deviation become zero. In this case, the I-controller ensures that the average value is precisely where it should be, i.e., no control deviation.

Switching preferably additionally takes place taking into account a limit value, in particular a limit value for the virtual flow error.

In yet another embodiment, switching takes place taking into account a current difference.

It is therefore also proposed to additionally or alternatively take into account a current difference.

The method preferably further comprises the steps: determining a first actual current of a first individual power converter of the power converter and determining a second actual current of a second individual power converter of the power converter and determining the current difference between the first actual current and the second actual current.

It is therefore in particular proposed to compare the actual currents of the individual power converters with one another or to take into account the actual currents of the individual power converters when switching.

Switching preferably takes place with a fixed clock frequency, in particular for at least one period of a switching frequency.

Switching with a fixed clock frequency preferably comprises a relative switch-on time.

When a limit is exceeded, in particular the upper or lower voltage limit, a new switching state is preferably set without delay.

A control unit for a power converter is further proposed which comprises a plurality of individual power converters connected in parallel for generating an output alternating current in each case which each have a control device and are set up in each case to generate an output alternating voltage by means of the control device in discrete switching states (−1, +1), comprising: a control system which is superordinate to the control devices and which is set up: to specify a nominal output voltage for the power converter, wherein the nominal output voltage is between two discretely adjustable output voltages (k, k+1), and to make a selection between one of the two output voltages (k, k+1), wherein the selection is made depending on at least one of the following list, comprising: the output alternating currents of the individual power converters or an integrated voltage error or a nominal voltage, and the switching states and the output currents of the individual power converters.

The selection between the two output voltages (k, k+1) is preferably made by comparing the greatest difference between the output alternating currents of the individual converters with a hysteresis threshold and, if this hysteresis threshold is exceeded, switching in such a way that this greatest difference becomes smaller as a result.

The control unit is preferably also set up to generate a switching process in at least one individual power converter if the individual power converter generates an output alternating current which exceeds a maximum permissible output alternating current.

The selection between the two output voltages (k, k+1) is preferably made by integrating over time a difference between the calculated actual output voltage resulting from actual switching states of the individual converters and the nominal output voltage and comparing a virtual flow calculated therefrom with a tolerance band threshold and, if this tolerance band threshold is exceeded, switching to the other output voltage (k, k+1), wherein the selection of the individual converter to be switched is made in such a way that a maximum difference of the output currents of the partial converters becomes smaller.

In addition, a switch between the two output voltages (k, k+1) additionally takes place if a maximum difference between the output alternating currents of the individual converters exceeds a limit value, wherein an individual converter is switched in the case of which this switch results in a reduction of a maximum difference between the output alternating currents of the individual converters.

For a fixed time range, a proportion of the time in which the one and the other of the two output voltages has been selected is preferably calculated in advance in such a way that a nominal output voltage is achieved as an average value of the output voltages over this time range.

If a nominal output voltage exceeds the nearest discretely adjustable voltage value, one of the two output voltages is preferably adjusted without delay and independent of the present state.

If a nominal output voltage exceeds a nearest discretely adjustable voltage value, a further individual converter is preferably switched without delay.

In this case, the switch between the two output voltages preferably follows with the individual converter or with the individual converters, in the case of which a switch is achieved for minimizing a maximum difference of the output currents of the individual converters.

BRIEF DESCRIPTION OF THE SEVERAL VIEWS OF THE DRAWINGS

The present invention is explained in greater detail hereinafter and using accompanying figures, wherein the same reference symbols are used for the same or similar components or assemblies.

DETAILED DESCRIPTION

Figure 1:
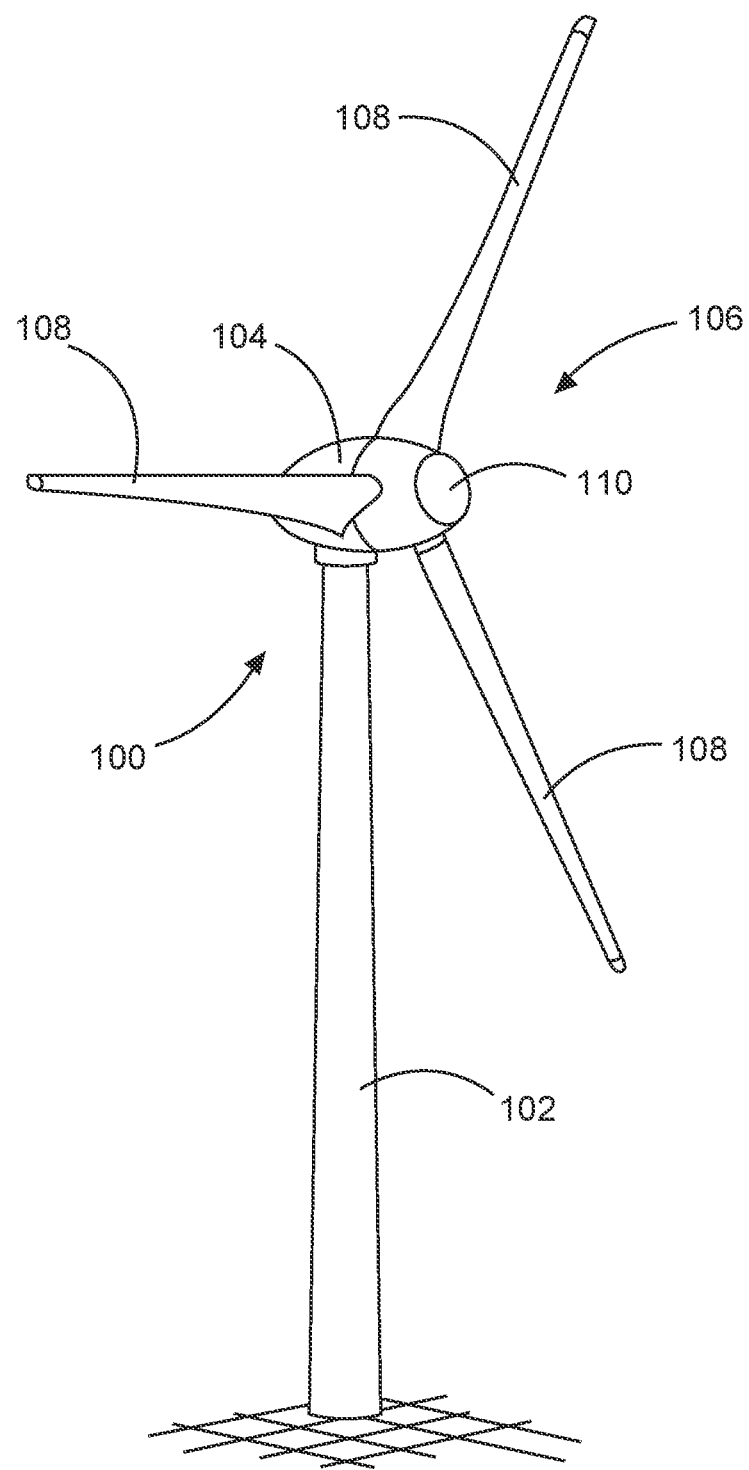
FIG. 1 shows in a schematic and exemplary manner a perspective view of a wind power installation in one embodiment.

FIG. 1 shows a perspective view of a wind power installation 100.

The wind power installation 100 has a tower 102 and a nacelle 104 for this purpose. An aerodynamic rotor 106 with three rotor blades 108 and a spinner 110 is arranged on the nacelle 104. The rotor 106 is transferred into a rotational movement by the wind during operation and thus drives a generator in the nacelle 104 of the wind power installation 100. As a result, the generator generates a current which is to be fed in and which is fed into an electrical supply network by means of a power converter.

Figure 2:
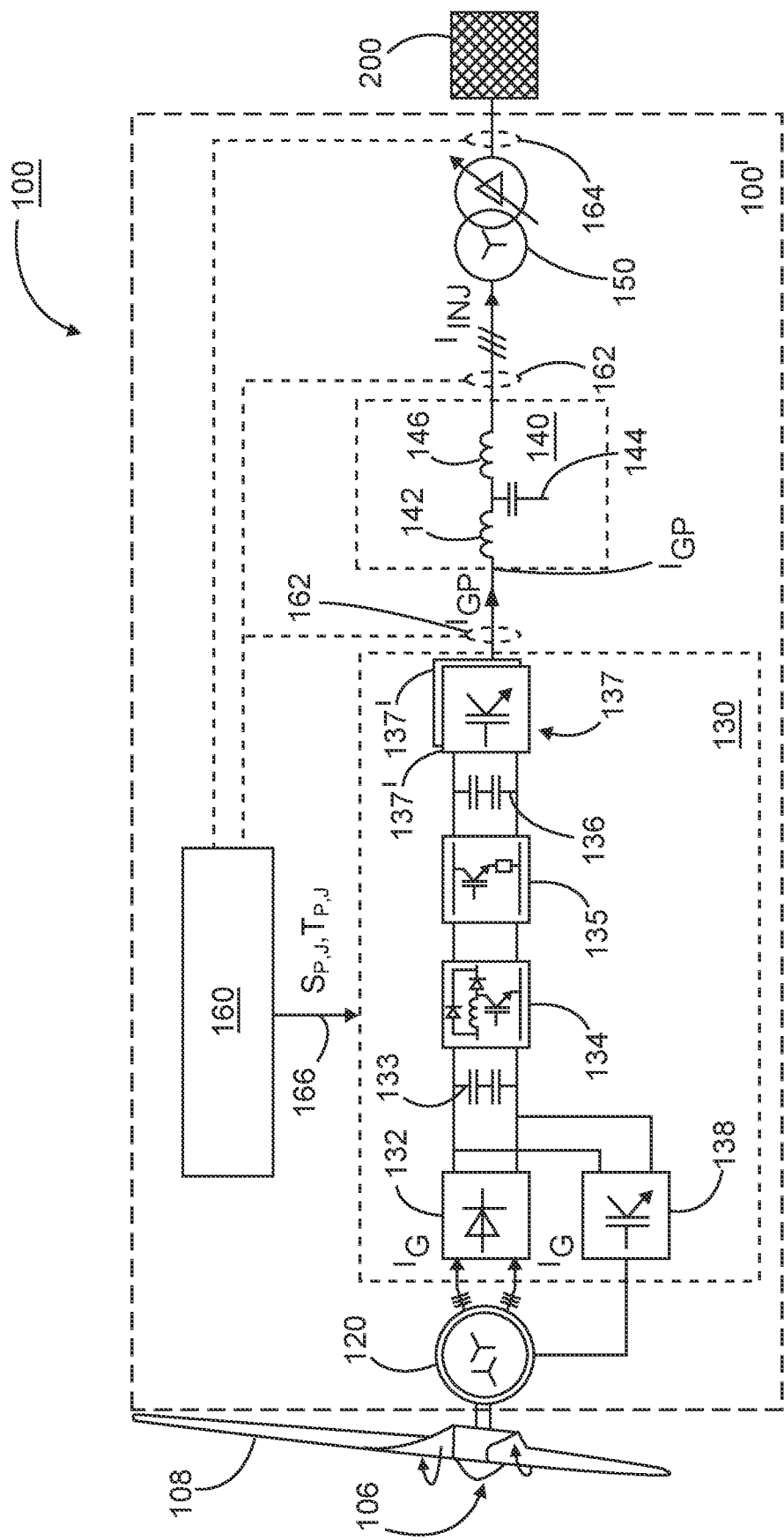
FIG. 2 shows in a schematic and exemplary manner a structure of an electrical line of a wind power installation in one embodiment.

FIG. 2 shows in a schematic and exemplary manner a structure of an electrical line 100' of a wind power installation 100 in one embodiment. The wind power installation 100 comprises an aerodynamic rotor 106 with three rotor blades 108, which rotor is connected to the electrical line 100' of the wind power installation in a mechanical manner.

The electrical line 100' comprises a generator 120, a converter 130, a network protection device 140, a transformer 150 which is connected to an electrical supply network 200 and a control unit (e.g., controller) 160.

The aerodynamic rotor 106 is set up to generate a mechanical rotational movement from the wind.

This mechanical rotational movement is transferred to the generator 120, for example by means of a wave.

The generator 120, which is preferably designed as a six-phase ring generator, is set up to generate an electrical energy from this mechanical rotational movement, in particular in the form of a multiphase alternating current, for example a three-phase or two times three-phase alternating current.

This multiphase alternating current is transferred to a converter 130, in order to feed it into the electrical supply network 200 by means of the network protection device 140 and the transformer 150.

For this purpose, the converter 130 essentially comprises a rectifier 132, a first direct voltage intermediate circuit 133, a step-up converter 134, a chopper 135, a second direct voltage intermediate circuit 136 and an inverter 137. In order to convert the current IG generated by the generator 120 into a current $I_g$ which is to be fed in, the converter 130 has a rectifier 132, for example a passive diode rectifier, at an input.

The rectifier 132 is connected to a first direct voltage intermediate circuit 133. The first direct voltage intermediate circuit 133 is connected to a step-up converter 134. The step-up converter 134 is connected to a chopper 135. The chopper 135 is connected to a second direct voltage intermediate circuit 136. The second direct voltage intermediate circuit 136 is connected to the inverter 137.

Figure 3:
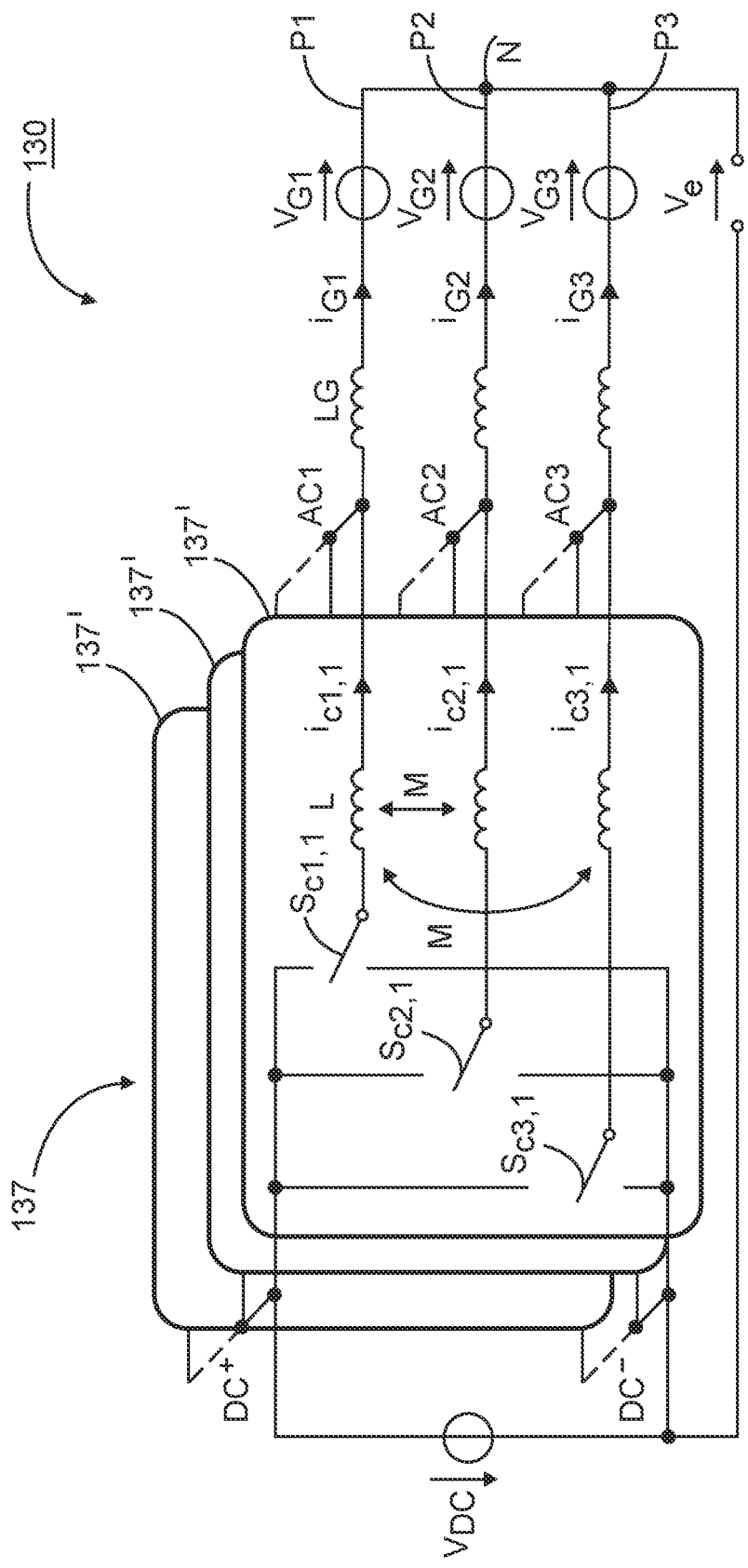
FIG. 3 shows in a schematic and exemplary manner the structure of an inverter.

The inverter 137 is connected to the network protection device 140 and consists of a plurality of partial inverters or inverter modules 137' connected in parallel, as shown in FIG. 3, for example, which have a total current igp. At the same time, the inverter forms the output of the converter 130. The inverter is additionally connected to the network protection device 140.

The network protection device 140 comprises a decoupling choke 142, a filter 144 and a power choke 146, for example. In one preferred embodiment the network protection device 140 is designed as an LCL filter. The network protection device 140 is additionally connected to the electrical supply network 200 via a wind power installation transformer 150. The network protection device 140 additionally forms from the generated total current $i_{gp}$ a current $I_{inj}$ which is to be fed in, i.e., the current which the wind power installation feeds into the electrical supply network 200, for example via a transformer.

In order to feed the current $I_{inj}$ which is to be fed in into the electrical supply network 200, a wind power installation transformer 150 is provided which is preferably connected in the star-delta.

The electrical supply network 200 to which the wind power installation 100 is connected by means of the transformer 150 can be a wind farm network or an electrical supply network or distribution network, for example.

A control unit 160 is further provided for controlling the electrical line 100'.

The control unit 160 is set up to detect the generated total current $i_{gp}$, and/or the current $I_{inj}$ which is to be fed in by means of a current detection device (e.g., current clamp or probe, current sensor, ammeter or multimeter) 162. In particular, the currents of each inverter module 137' are preferably detected in each phase.

In addition, the control unit also has voltage detection device (e.g., voltage clamp or probe, voltage sensor, voltmeter or multimeter) 164 which are set up to detect a line voltage of the electrical supply network 200.

In one particularly preferred embodiment, the control unit 160 is additionally set up to also detect the phase angle and the amplitude of the current $I_{inj}$ which is to be fed in.

The control unit 160 then determines the switch settings $S_{p,j}$ of the individual switches of the inverters from the values detected in this way by means of a method described previously or hereinafter.

The control unit 160 can be part of a wind power installation control unit (e.g., controller) or designed as a separate component. In one particularly preferred embodiment, the control unit 160 is additionally set up to detect a phase angle $\varphi$ and an amplitude $\hat{i}$ of the current $I_{inj}$ which is to be fed in.

The control unit 160 then determines the switch setting $S_{p,j}$ of each partial inverter 137' from the values detected in this way by means of a method described previously or hereinafter.

FIG. 3 shows in a schematic and exemplary manner the structure of an inverter, in particular of a partial inverter 137' or inverter module 137', as shown in FIG. 2.

The inverter 137 is part of a converter 130 and comprises three partial inverters or inverter modules 137' which are representative of a plurality of inverter modules 1, 2, ..., n.

The inverter modules 137' are connected to an intermediate circuit direct voltage $V_{DC}$ on the direct voltage side via a common direct voltage intermediate circuit.

The intermediate circuit direct voltage $V_{DC}$ has a positive potential $DC^+$ and a negative potential $DC^-$ which are preferably essentially the same size in terms of magnitude.

Furthermore, the inverter modules 137' are connected to the three phases P1, P2, P3 on the alternating voltage side via a three-phase alternating voltage network. In this case, the three phases P1, P2, P3 can also be understood in a simplified manner as phase p with consecutive numbering.

The phases P1, P2, P3 each have an inductance L as well as a magnetic coupling M and are connected in the star by means of a star point N which preferably conducts a neutral conductor with a voltage $V_e$.

Each inverter module 137' in each case has a switch $S_{cp,j}$ for each phase p, wherein the switches $S_{c1,1}$, $S_{c2,1}$ and $S_{c3,1}$ can take the discrete values +1 and −1 in each case. As a result, each inverter module 137' generates one current $i_{c1,j}$ per phase p. The first inverter module therefore generates the current $i_{c1,1}$ in the first phase P1, the current $i_{c2,1}$ in the second phase P2 and the current $i_{c3,1}$ in the third phase P3. The second inverter module then generates the current $i_{c1,2}$ in the first phase P1, the current $i_{c2,2}$ in the second phase P2 and the current $i_{c3,2}$ in the third phase P3, etc.

These currents $i_{cp,j}$ generated in this way are combined in phases by means of the nodal points AC1, AC2, AC3 to form a sum current $i_{g,1}$, $i_{g,2}$, $i_{g,3}$ in each case, which give the total current $i_{gp}$.

Each phase P1, P2, P3 additionally has a total inductance Lg as well as a voltage $V_{g1}$, $V_{g2}$, $V_{g3}$.

Figure 4:
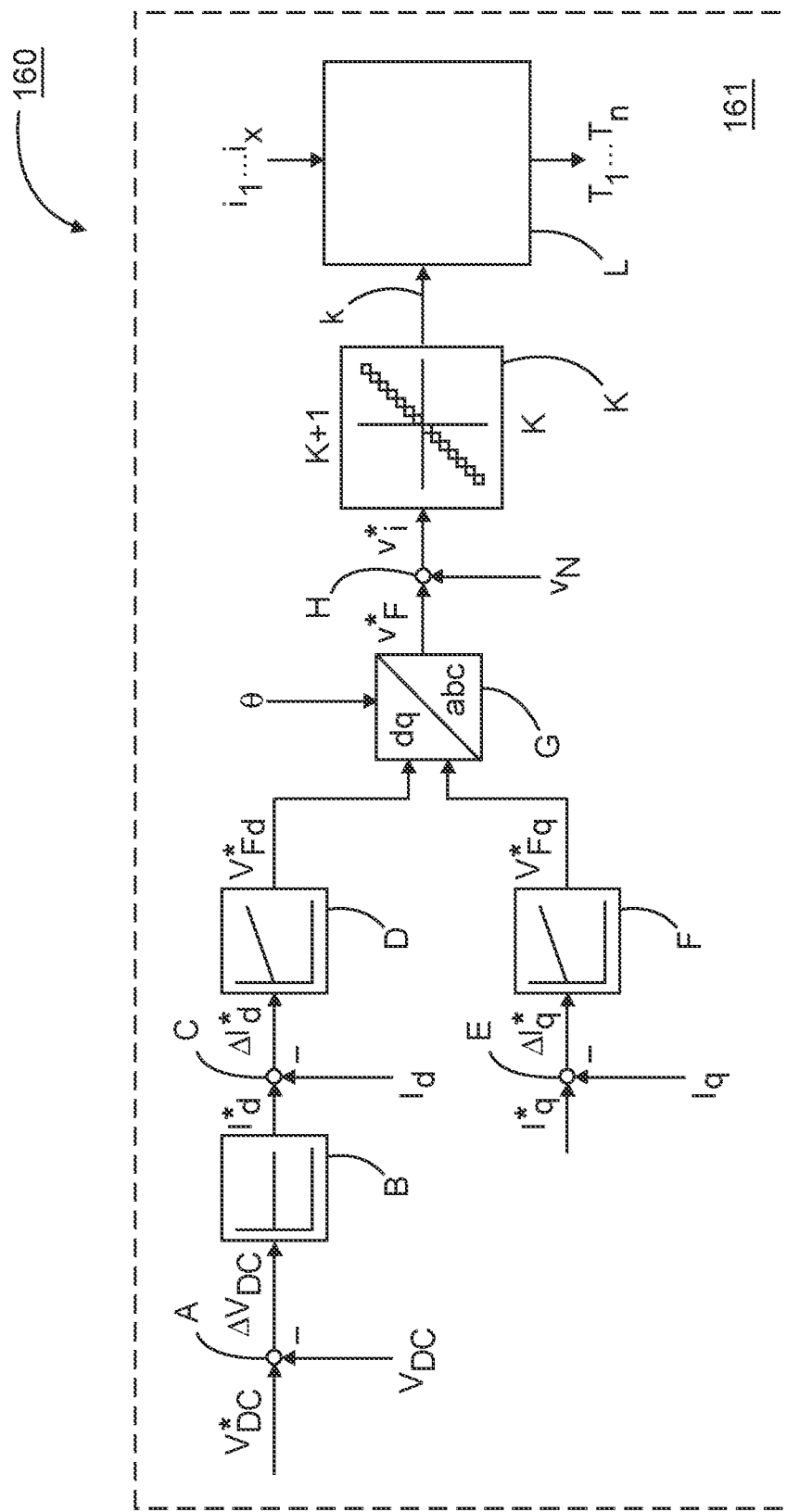
FIG. 4 shows in a schematic and exemplary manner the structure of a control unit for a power converter.

FIG. 4 shows in a schematic and exemplary manner the structure of a control unit 160 for a power converter, in particular for an inverter 137, as shown in FIG. 2, for example.

The control unit 160 comprises a control system 161 which is superordinate to the control devices.

The superordinate control system 161 is set up to specify a nominal output voltage $v_i^*$ for a power converter, in particular for the inverter 137 shown in FIG. 2.

Figure 5:
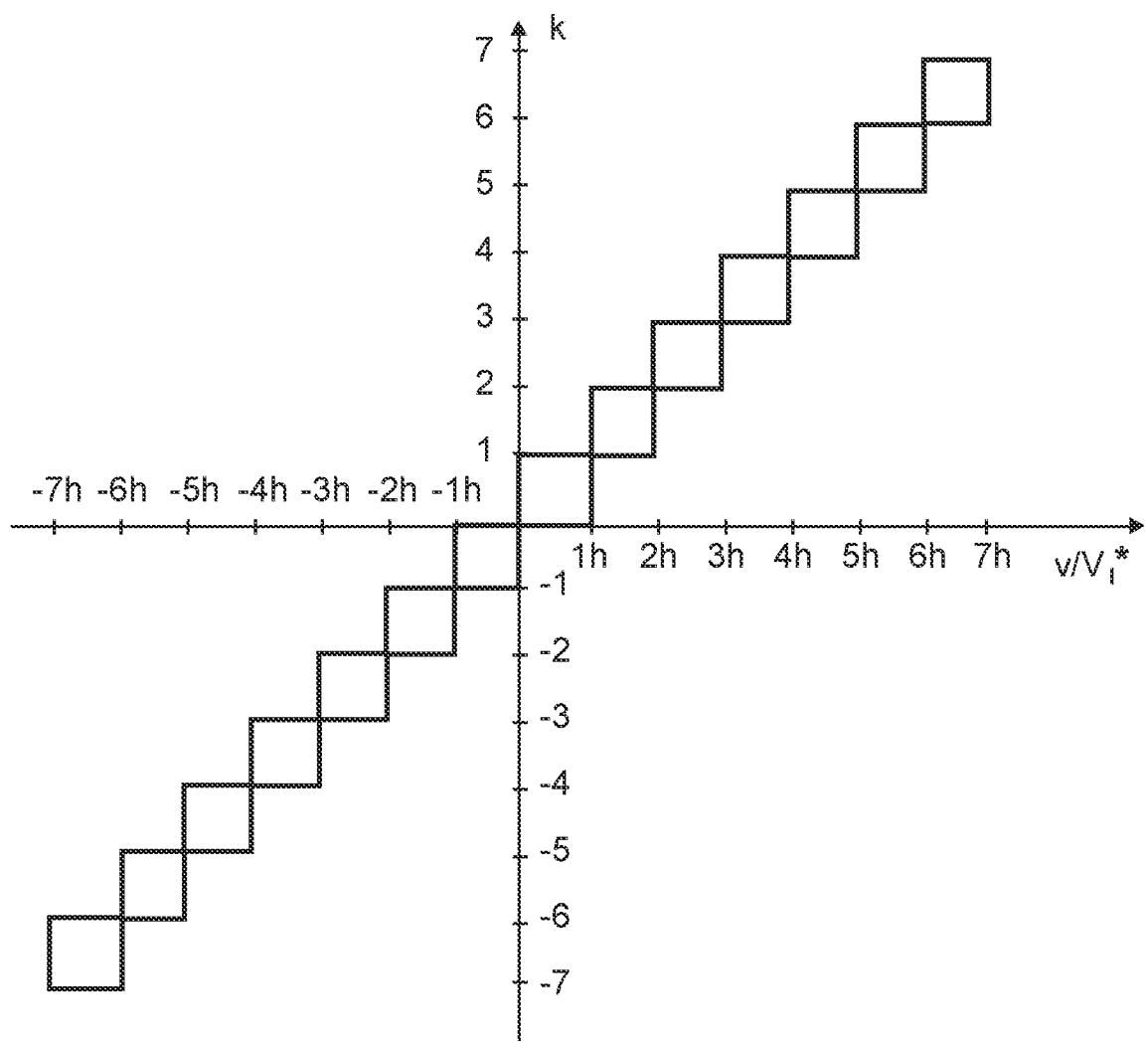
FIG. 5 shows in a schematic and exemplary manner a representation of discretely adjustable output voltages for a nominal output voltage.

In this case, the nominal output voltage $v_i^*$ for the power converter is preferably between two discretely adjustable output voltages k, k+1, as shown in a detailed manner in FIG. 5, for example.

The control unit 161 comprises a first voltage comparison A, a first voltage controller B, a first current comparison C, a first current controller D, a second current comparison E, a second current controller F, a transformation G, a second voltage comparison H, discrete voltage values K and a drive L.

The voltage comparison A ascertains a direct voltage deviation $\Delta V_{DC}$ from an intermediate circuit nominal voltage $V_{DC}^*$ and an intermediate circuit actual voltage $V_{DC}$.

The direct voltage deviation $\Delta V_{DC}$ is transferred to a first voltage controller B.

The first voltage controller B is preferably designed as a proportional (P) controller and generates a nominal current $I_d^*$ for the d coordinate of the inverter from the direct voltage deviation $\Delta v_{DC}$.

The nominal current $I_d^*$ for the d coordinate of the inverter is transferred to a first current comparison C.

The first current comparison C ascertains a first current deviation $\Delta I_d^*$ from the nominal current $I_d^*$ for the d coordinate of the inverter and an actual current $I_d$ of the d coordinate of the inverter.

The first current deviation $\Delta I_d^*$ is transferred to a first current controller D.

The first current controller D is preferably designed as a proportional-integral (PI) controller and generates a first nominal voltage $V_{Fd}^*$ for the d coordinate of the inverter from the first current deviation $\Delta I_d^*$.

The first nominal voltage $V_{Fd}^*$ for the d coordinate of the inverter is transferred to the transformation G.

Furthermore, the second current comparison E ascertains a second current deviation $\Delta I_q^*$ from a nominal current $I_q^*$ for the q coordinate of the inverter and an actual current $I_q$ of the q coordinate of the inverter.

The second current deviation $\Delta I_q^*$ is transferred to a second current controller F.

The second current controller D is preferably designed as a PI controller and generates a second nominal voltage $V_{Fq}^*$ for the d coordinate of the inverter from the second current deviation $\Delta I_q^*$.

The second nominal voltage $V_{Fq}^*$ for the q coordinate of the inverter is transferred to the transformation G.

The transformation G transforms the first nominal voltage $V_{Fd}^*$ and the second nominal voltage $V_{Fq}^*$ into a third voltage set point value $V_F^*$ in abc coordinates, taking into account an electrical angle $\Theta$.

The third voltage set point value $v_F^*$ is compared in a second voltage comparison with the generated total voltage $v_N$ of all N inverter modules, in order to generate the nominal output voltage $v_i^*$ for the inverter.

A switch setting k is selected from the nominal output voltage $v_i^*$ by means of the discrete voltage values and is output to the drive L.

This drive L ascertains the corresponding switching commands Tcp,j, i.e., $T_1, \ldots, T_n$, taking into account all currents of all phases of all converter modules.

FIG. 5 shows in a schematic and exemplary manner a representation 500 of discretely adjustable output voltages for a nominal output voltage, in particular as shown in block K of FIG. 4.

In the representation, the switching states k are plotted over the voltage v.

The available intermediate circuit direct voltage is firstly divided into N equal voltage ranges, for example 14 voltage ranges.

These 14 voltage ranges are delimited upward and downward in each case by possible, discrete output voltages. This means in particular that only one output voltage is set at the converter by the switching states k, which can only take discrete values (on the lines) as a result of the discrete switching states.

However, the nominal output voltage $v_i^*$ which is determined for the converter is usually between these two discrete values.

In order to still set the nominal output voltage $v_i^*$ as an actual voltage, it is therefore in particular proposed to switch back and forth between switching states k, k+1, as described previously or hereinafter.

Figure 6:
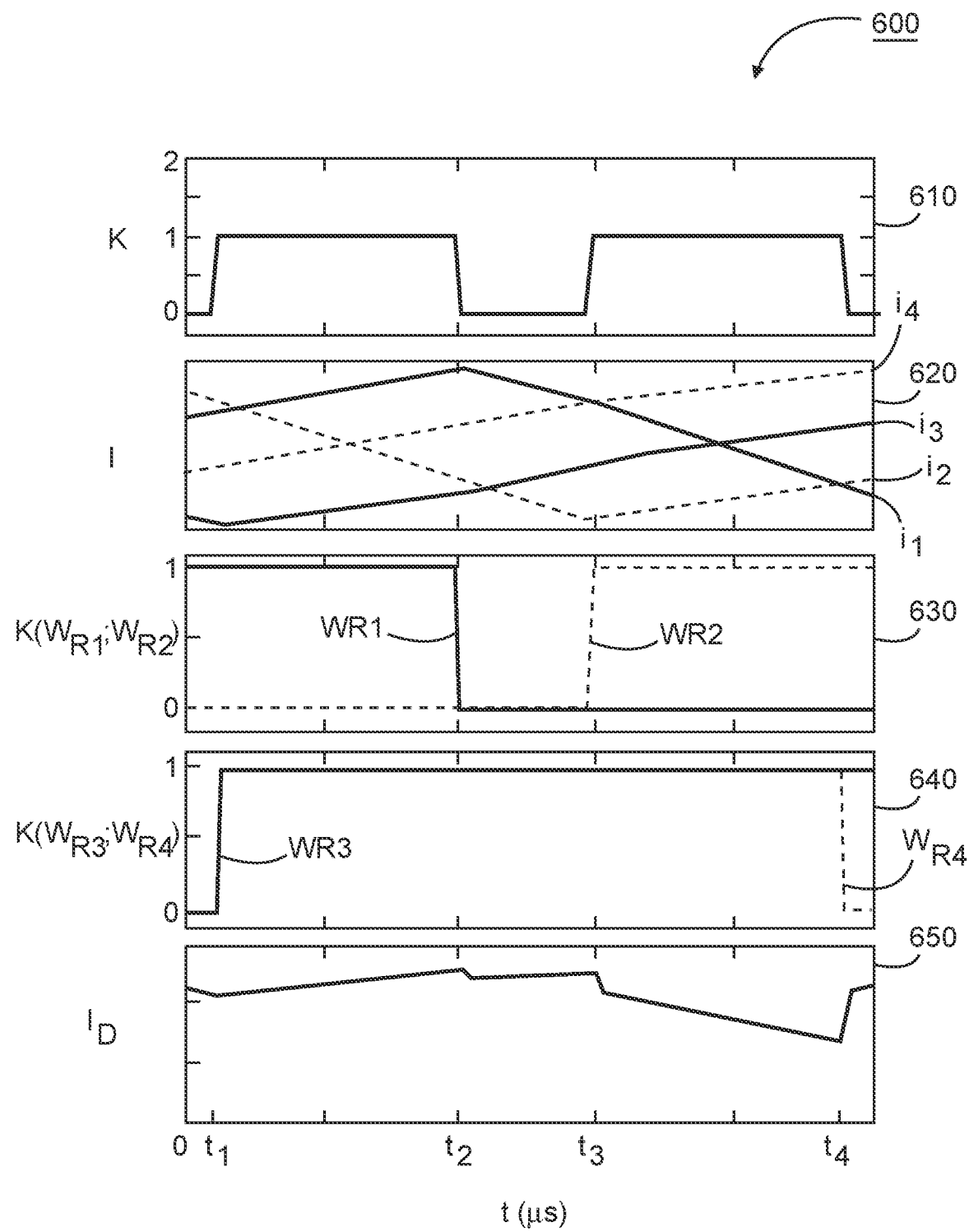
FIG. 6 shows the switch behavior of a plurality of partial power converters according to one embodiment.

FIG. 6 shows the switch behavior 600 of a plurality of partial power converters WR1, WR2, WR3, W4 according to one embodiment.

The partial power converters WR1, WR2, WR3, WR4 are designed as inverters, for example as an inverter module or partial inverter, as shown in FIG. 2 or FIG. 3.

In the first diagram 610, the switching state k is mapped over time.

In the second diagram 620, the output currents $i_1, i_2, i_3, i_4$ of the partial power converters WR1, WR2, WR3, WR4 are mapped over time.

In the third diagram 630, the switching states of the partial power converters WR1, WR2 are mapped.

In the fourth diagram 640, the switching states of the partial power converters WR3, WR4 are mapped.

In the fifth diagram 650, the total current $i_D$ of the partial power converters WR1, WR2, WR3, WR4 is mapped.

The five diagrams 610, 620, 630, 640, 650 are synchronous relative to one another.

In order to achieve an actual current $i_D$, the drive must switch back and forth between the switching states k=0 and k=1. This is shown in diagram 610.

At the time $t_1$, the switching state is changed from k=0 to k=1.

The drive realizes this switching state k=1 by switching the third partial power converter WR3, as shown in diagram 640.

At the time $t_2$, the switching state is changed again from k=1 to k=0.

The drive realizes this switching state k=0 by switching the first partial power converter WR1, as shown in diagram 630.

At the time $t_3$, the switching state is changed again from k=0 to k=1.

The drive realizes this switching state k=1 by switching the second partial power converter WR2, as shown in diagram 630.

At the time $t_4$, the switching state is changed again from k=1 to k=0.

The drive realizes this switching state k=0 by switching the fourth partial power converter WR4, as shown in diagram 640.

The current $i_D$ resulting from these switching processes is mapped in the fifth diagram 650.

Figure 7A:
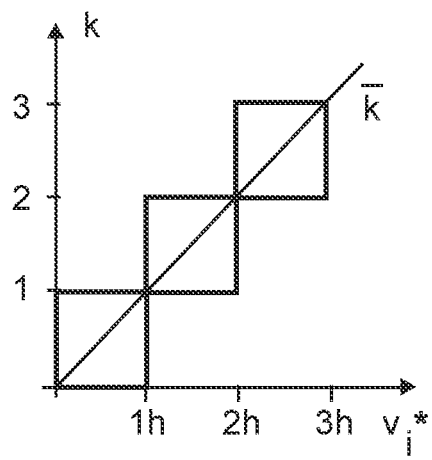
FIG. 7A shows discretely adjustable output voltages for a flow control.

FIG. 7A shows discretely adjustable output voltages for a flow control.

Figure 7B:
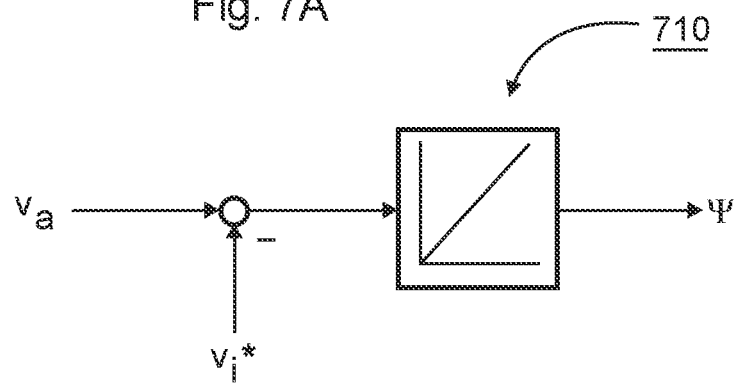
FIG. 7B shows a controller for a flow control.

FIG. 7B shows a controller 710 for a flow control.

The controller 710 is designed as an I controller and integrates a voltage error from actual output voltage $v_a$ and nominal output voltage $v_i^*$. The nominal output voltage $v_i^*$ is therefore subtracted from the actual output voltage $v_a$. The voltage error ascertained in this way is integrated and a virtual flow $\Psi$ calculated.

Figure 7C:
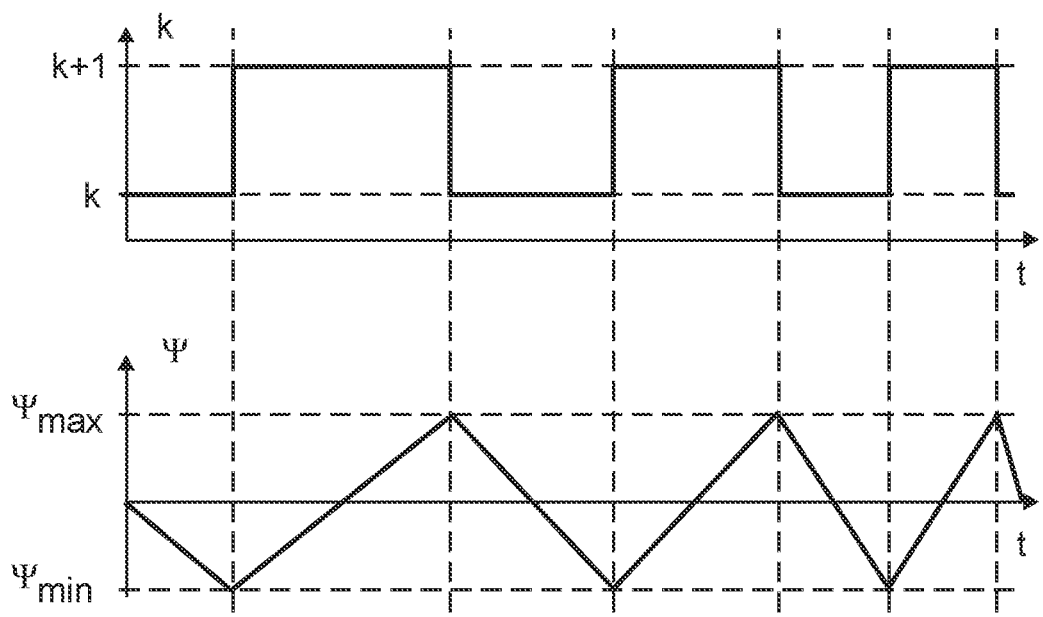
FIG. 7C shows the switching behavior for a flow control.

FIG. 7C shows the switching behavior for a flow control.

In this case, it is in particular proposed that the switching state k is changed in particular if a limit value is exceeded.

A switching state of k results in a decreasing flow error. If the flow error has fallen below a limit value, the switching state is switched to k+1. A switching state of k+1 results in an increasing flow error. If the flow error has exceeded a limit value, the switching state is switched to k. A set point value which is in the middle of two switching states results in the flow error changing more quickly than one which is close to a switching state, therefore the resulting switching frequency is not constant. However, it is independent of the load. The maximum switching frequency can be calculated in advance. The limit value can either be constant or depend on the nominal voltage or on the current.

In addition, the current difference is optionally monitored, as described previously, and used for triggering additional switching processes. This makes it possible to prevent the output currents of the individual power converters from diverging if the set point value of the voltage is precisely at a discretely adjustable voltage level and the flow error therefore does not increase.

Figure 8:
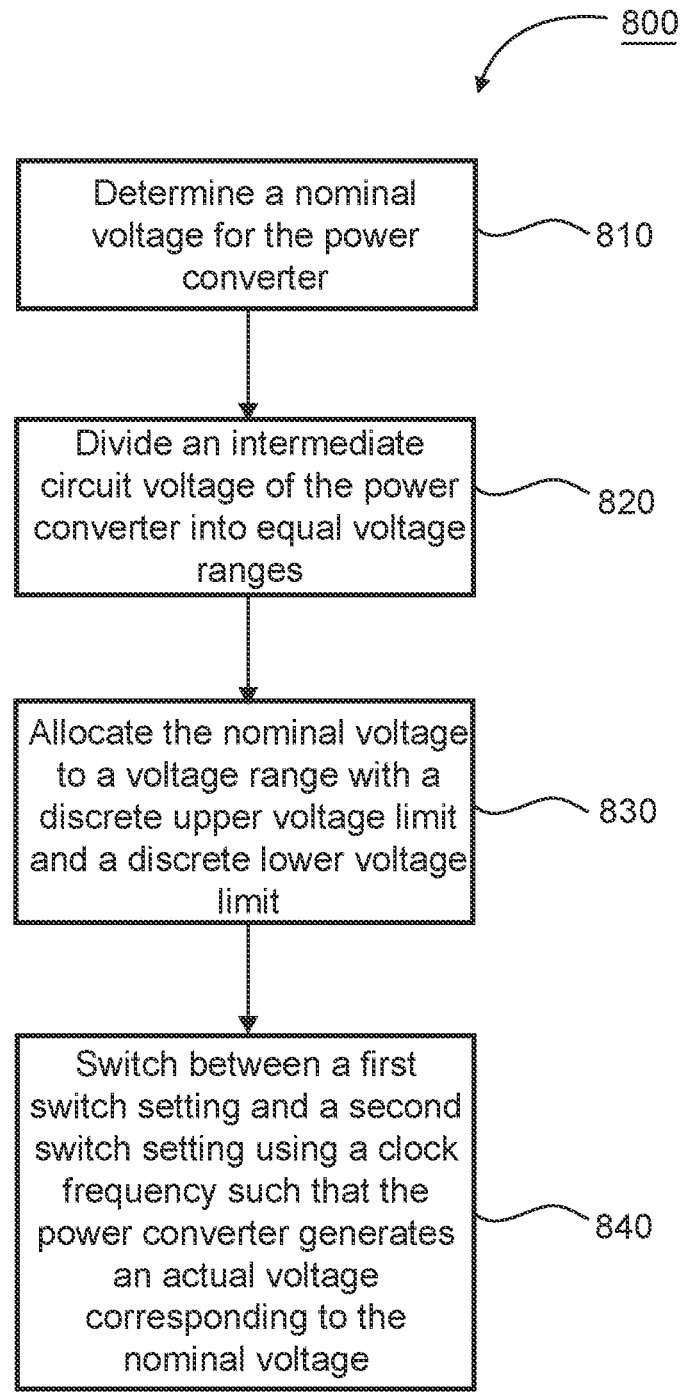
FIG. 8 shows the sequence of a method for controlling a power converter.

FIG. 8 shows the sequence 800 of a method for controlling a power converter.

In a first step 810, a nominal voltage is determined for the power converter.

In a subsequent step 820, an intermediate circuit voltage of the power converter is divided into equal voltage ranges, wherein the voltage ranges are limited by a discrete upper voltage limit and a discrete lower voltage limit.

In a subsequent step 830, allocating the nominal voltage to one of these voltage ranges with a discrete upper voltage limit and a discrete lower voltage limit, allocating a first switch setting to the lower voltage limit and allocating a second switch setting to the upper voltage limit take place.

In a subsequent step 840, switching between the first switch setting and the second switch setting takes place with a clock frequency, so that the power converter generates an actual voltage which essentially corresponds to the nominal voltage.

LIST OF REFERENCE SYMBOLS 100 wind power installation
100' electrical line, in particular of the wind power installation
102 tower, in particular of the wind power installation
104 nacelle, in particular of the wind power installation
106 aerodynamic rotor, in particular of the wind power installation
108 rotor blade, in particular of the wind power installation
110 spinner, in particular of the wind power installation
120 generator, in particular of the wind power installation
130 converter, in particular of the wind power installation
132 rectifier, in particular of the converter
133 first direct voltage intermediate circuit, in particular of the converter
134 step-up converter, in particular of the converter
135 chopper, in particular of the converter
136 second direct voltage intermediate circuit, in particular of the converter
137 inverter, in particular of the converter 137' partial inverter or inverter module, in particular of the converter
140 network protection device, in particular of the wind power installation
150 transformer, in particular of the wind power installation
160 control unit, in particular of the wind power installation
161 superordinate control system, in particular of the control unit
200 electrical supply network
600 switching behavior
610 first diagram
620 second diagram
630 third diagram
640 fourth diagram
650 fifth diagram
AC nodal points of all conductors of one phase
c number of the partial current
$DC^+$ positive potential, in particular of the intermediate circuit direct voltage
$DC^-$ negative potential, in particular of the intermediate circuit direct voltage
$I_{cp,j}$ current of one phase of an inverter module
$I_d$ actual current, in particular for a d coordinate
$I^*_d$ nominal current, in particular for a d coordinate
Iq,p total current of one phase
$I_q$ actual current, in particular for a q coordinate
$I^*_q$ nominal current, in particular for a q coordinate
$I_{gp,j}$ total current of one phase of all inverter modules
$I_G$ current of the generator
$I_{gp}$ total current of the inverter
$I_{INJ}$ current of the wind power installation, in particular current which is to be fed in
$i_{g,1}$, $i_{g,2}$, $i_{g,3}$ sum current
$i_1$, $i_2$, $i_3$, $i_4$ output currents
$i_{c1,j}$, $i_{c1,1}$ current
$i_{c2,1}$ $i_{c3,1}$ current
$i_{c1,2}$, $i_{c2,2}$, $i_{c3,2}$ current
i amplitude of the current which is to be fed in
j number of the partial power converter
k switching states
Lg total inductance, in particular of one phase
p phase, in particular of an alternating voltage network
P1 first phase, in particular of the alternating voltage network
P2 second phase, in particular of the alternating voltage network
P3 third phase, in particular of the alternating voltage network
t, $t_2$, $t_3$, $t_4$ time
$V_{DC}^*$ intermediate circuit nominal voltage, in particular of an intermediate circuit
$V_{DC}$ intermediate circuit actual voltage, in particular of an intermediate circuit
$V_e$ voltage, in particular of the neutral conductor
$v_i^*$ nominal output voltage, in particular for a power converter
$V_F^*$ third nominal voltage, in particular in abc coordinates
$V_{Fd}^*$ first nominal voltage, in particular for a d coordinate
$V_{Fq}^*$ second nominal voltage, in particular for a q coordinate
Vg,p voltage of one phase
S switch, in particular of one phase of an inverter module
$S_{cp,j}$ switch setting, in particular of a specific switch
$S_{c1,1}$ switch
$S_{c2,1}$ switch
$S_{c3,1}$ switch
$\Delta I_d^*$ first current deviation, in particular of a d coordinate
$\Delta I_q^*$ second current deviation, in particular of a q coordinate
$\Delta U_{DC}$ direct voltage deviation
φ phase angle of the current which is to be fed in
Θ electrical angle
Ψ virtual flow
A first voltage comparison
B first voltage controller
C first current comparison
D first current controller
E second current comparison
F second current controller
G transformation
H second voltage comparison
K discrete voltage values
L drive
WR partial power converter The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A method for controlling a power converter having a plurality of partial power converters coupled in parallel, comprising:
determining a nominal voltage for the power converter;
dividing an output voltage for the power converter into a plurality of voltage ranges, wherein:
the plurality of voltage ranges are limited by an upper voltage limit and a lower voltage limit, and
the plurality of voltage ranges are adjusted by switching the plurality of partial power converters;
allocating the nominal voltage to one of the plurality of voltage ranges;
allocating a first switch setting to the lower voltage limit;
allocating a second switch setting to the upper voltage limit; and
switching between the first switch setting and the second switch setting to cause the power converter to generate a voltage corresponding to the nominal voltage.

2. The method as claimed in claim 1, wherein the plurality of voltage ranges are equal in size.

3. The method as claimed in claim 1, comprising:
determining output currents of the plurality of partial power converters;
determining a difference between a highest output current of a first partial power converter of the plurality of partial power converters and a lowest output current of a second partial power converter of the plurality of partial power converters; and
switching between the first switch setting and the second switch setting depending on the output currents of the plurality of partial power converters.

4. The method as claimed in claim 3, comprising:
specifying a limit value for the difference between the highest output current of the first partial power converter of the plurality of partial power converters and the lowest output current of the second partial power converter of the plurality of partial power converters; and performing the switching between the first switch setting and the second switch setting in response to the limit value being exceeded.

5. The method as claimed in claim 1, comprising:
determining a voltage from the first switch setting and/or the second switch setting; and
switching between the first switch setting and the second switch setting depending on the determined voltage.

6. The method as claimed in claim 5, comprising:
determining an error voltage by comparing the voltage with the nominal voltage.

7. The method as claimed in claim 6, comprising:
integrating the error voltage to produce a virtual flow error.

8. The method as claimed in claim 7, comprising:
switching between the first switch setting and the second switch setting based on a limit value for the virtual flow error.

9. The method as claimed in claim 1, wherein
determining a first current of a first partial power converter of the plurality of partial power converters of the power converter; and
determining a second current of a second partial power converter of the plurality of partial power converters of the power converter; and
determining a current difference between the first current and the second current; and
switching between the first switch setting and the second switch setting based on the current difference.

10. The method as claimed in claim 1, comprising:
switching between the first switch setting and the second switch setting with a fixed clock frequency for at least one period of a switching frequency.

11. The method as claimed in claim 10, wherein switching with the fixed clock frequency includes a relative switch-on time.

12. The method as claimed in claim 10, wherein in response to the upper voltage limit or the lower voltage limit being exceeded, a new switching state is set without delay.

13. A controller for a power converter,
wherein the power converter includes:
a plurality of individual power converters coupled in parallel and each configured to respectively generate an output alternating current, each individual power converter of the plurality of individual power converters being associated with a respective individual controller of a plurality of individual controllers and configured to generate an output alternating voltage using the respective individual controller and based on discrete switching states, and
wherein the controller is superordinate to the plurality of individual controllers and configured to:
specify a nominal output voltage for the power converter, wherein the nominal output voltage is between two discretely adjustable output voltages; and
select one of the two output voltages depending on:
at least one of: output alternating currents of the plurality of individual power converters, an integrated voltage error or a nominal voltage; and
the discrete switching states and output alternating currents of the plurality of individual power converters.

14. The controller as claimed in claim 13, wherein the controller is configured to select one of the two output voltages by at least:
comparing a largest difference between two output alternating currents of the plurality of individual power converters with a hysteresis threshold; and
in response to the largest difference exceeding the hysteresis threshold, selecting one of the two output voltages to cause the largest difference between the two output alternating currents to become smaller.

15. The controller as claimed in claim 13, wherein the controller is configured to perform a switching process in at least one individual power converter of the plurality of individual power converters in response to the at least one individual power converter generating a respective output alternating current that exceeds a maximum output alternating current.

16. The controller as claimed in claim 13, wherein the controller is configured to select one of the two output voltages by at least:
integrating, over time, a difference between a calculated output voltage resulting from switching states of individual converters and the nominal output voltage;
determining a virtual flow based on integrating the difference of the calculated output voltage and the nominal output voltage;
comparing the virtual flow with a tolerance band threshold; and
in response to the virtual flow exceeding the tolerance band threshold, switching to from the one of the two output voltages to another of the two output voltages, wherein a selection of an individual power converter to be switched is made such that a maximum difference of the output alternating currents of the plurality of individual power converters becomes smaller.

17. The controller as claimed in claim 13, wherein switching between the two output voltages is performed in response to a maximum difference between the output alternating currents of the plurality of individual power converters exceeding a limit value, wherein an individual converter is switched to reduce the maximum difference between the output alternating currents of the plurality of individual power converters.

18. The controller as claimed in claim 13, wherein the controller is configured to:
determine a first proportion of time in a fixed time range in which a first voltage of the two output voltages is selected and determine a second proportion of time in the fixed time range in which a second voltage of the two output voltages is selected to cause an average value of output voltages over the fixed time range to correspond to the nominal output voltage.

19. The controller as claimed in claim 13, wherein the controller is configured to, in response to the nominal output voltage exceeding a discretely adjustable output voltage, adjust one of the two output voltages independent of a present state.

20. The controller as claimed in claim 13, wherein the controller is configured to, in response to the nominal output voltage exceeding a nearest discretely adjustable voltage value, switch a further individual power converter of the plurality of individual power converters.

21. The controller as claimed in claim 13, wherein the controller is configured to:

switch between the two output voltages to minimize a maximum difference between the output alternating currents of the plurality of individual power converters.

\* \* \* \* \*